US008417508B2

(12) United States Patent
Kenney et al.

(10) Patent No.: US 8,417,508 B2
(45) Date of Patent: Apr. 9, 2013

(54) MULTIPROCESSOR DEVELOPMENT ENVIRONMENT

(75) Inventors: James Kenney, Oxfordshire (GB); Simon Davidmann, Oxfordshire (GB)

(73) Assignee: Imperas Software Ltd., Oxfordshire (GB)

( * ) Notice: Subject to any disclaimer, the term of this patent is extended or adjusted under 35 U.S.C. 154(b) by 0 days.

(21) Appl. No.: 12/307,636

(22) PCT Filed: Jul. 6, 2007

(86) PCT No.: PCT/GB2007/050385
§ 371 (c)(1),
(2), (4) Date: Jul. 2, 2009

(87) PCT Pub. No.: WO2008/004006
PCT Pub. Date: Jan. 10, 2008

(65) Prior Publication Data
US 2010/0017183 A1   Jan. 21, 2010

(30) Foreign Application Priority Data

Jul. 6, 2006 (GB) .................................. 0613409.2
May 2, 2007 (GB) .................................. 0708497.3

(51) Int. Cl.
*G06F 9/455* (2006.01)
*G06F 9/44* (2006.01)
*G06F 13/10* (2006.01)
*G06F 13/12* (2006.01)

(52) U.S. Cl.
USPC ............................................ 703/26; 703/21

(58) Field of Classification Search .............. 703/13, 703/20, 26, 21
See application file for complete search history.

(56) References Cited

U.S. PATENT DOCUMENTS

| 2002/0147969 A1* | 10/2002 | Lethin et al. .................. 717/138 |
| 2003/0079094 A1 | 4/2003 | Rajwar et al. |
| 2007/0078640 A1* | 4/2007 | Gabor et al. .................... 703/21 |

FOREIGN PATENT DOCUMENTS

| EP | 1 635 255 | 3/2006 |
| EP | 1635255 A2 * | 3/2006 |
| GB | 2 436 631 | 10/2007 |

OTHER PUBLICATIONS

Hammond, Lance et al., "Programming with Transactional Coherence and Consistency (TCC)", Oct. 7-13, 2004, ASPLOS'04, ACM.*
Krishnan, Venkata et al., "A Chip-Multiprocessor Architecture with Speculative Multithreading", Sep. 1999, IEEE Transactions on Computers, vol. 48, No. 9.*
International Preliminary Report on Patentability, dated Jan. 6, 2009, issued in priority International Application No. PCT/GB2007/050385.

(Continued)

*Primary Examiner* — David Silver
*Assistant Examiner* — Cedric D Johnson
(74) *Attorney, Agent, or Firm* — Saul Ewing LLP

(57) ABSTRACT

In a method of simulating a multi-processor system by running code that simulates the system on a host processor, a SPECULATE and a COMMIT instruction is used to mark an area of memory, shared across several simulated processors, and the code is translated at run time to a form required by the host processor. All instructions are mapped to a native instruction set of the host using two different code dictionaries: all instructions outside a SPECULATE/COMMIT region are mapped to the first of the two code dictionaries. If a SPECULATE instruction is encountered during runtime by a simulator running the code, the instructions are mapped to a native instruction set of the host using the second code dictionary.

9 Claims, 7 Drawing Sheets

OTHER PUBLICATIONS

Written Opinion, issued in priority International Application No. PCT/GB2007/050385.

Hammond et al., "Programming with Transactional Coherence and Consistency," ASPLOS '04, Oct. 2004, pp. 1-13 (XP002459206).

Hammond et al., "Transactional coherence and consistency: simplifying parallel hardware and software," IEEE Micro, vol. 24, No. 6, pp. 92-103 (Dec. 2004) (XP002459207).

International Search Report, dated Nov. 30, 2007, issued in priority International Application No. PCT/GB2007/050385.

* cited by examiner

MULTIPROCESSOR DEVELOPMENT ENVIRONMENT

CROSS REFERENCE TO RELATED APPLICATIONS

This application claims the priority of PCT/GB2007/050385, filed on Jul. 6, 2007, which claims priority to GB 0613409.2, filed Jul. 6, 2006 and GB 0708497.3, filed May 2, 2007, the entire contents of which are hereby incorporated in total by reference.

BACKGROUND OF THE INVENTION

1. Field of the Invention

This invention relates to a multiprocessor development environment. It enables a multiprocessor system to be simulated by running code on a host processor.

2. Description of the Prior Art

The increasing use of multiple processors in the design of electronic systems has forced changes in the style of programming used. The parallel operation of multiple processors requires careful management of the instructions which require any READ or WRITE from the system memory. This is due to the fact that the memory is accessible to all the processors in the system and it is important that any such accesses occur in the correct order to maintain the integrity of data.

Early designs used TEST and SET instructions which controlled the read or write of a single location, verifying that the data was valid before it was passed to the part of the system that had requested it. The main drawback of this technique was that the TEST instructions set a semaphore which prevented all other processors accessing the memory until the SET instruction released it. This resulted in the entire system waiting for the semaphore to be released. Since data clashes in parallel systems are quite infrequent, this resulted in a lot of time spent waiting where there was no danger of data corruption.

A more recent and better technique is the use of SPECULATE and COMMIT instructions (see Hammond, L., Carlstrom, B., Wong, V., Hertzberg. B., Chen, M., Kozyrakis, C. and Olukotun, K., "Programming with Transactional Coherence and Consistency" ASPLOS'04, Boston, Mass., U.S.A., October 2004.). These instructions, like the TEST and SET ones, mark an area where memory access requires careful management. However, they differ in two ways: firstly, instead of dealing with a simple READ or WRITE instruction from a single location, the region between the SPECULATE and COMMIT instructions may include a long sequence of instructions which depend on the data from memory and, secondly, the SPECULATE instruction does not set a semaphore which prevents other processors from accessing the memory as the TEST instruction does. The fill section of code, known as a transaction, within a SPECULATE/COMMIT region is atomic, i.e. it must either complete in its entirety or it will be deemed to have failed, resulting in a software exception.

The SPECULATE/COMMIT process relies on the use of local cache, known as the level 1 cache (FIG. 1) to store data while the series of instructions that make up the single transaction within a SPECULATE/COMMIT region is being completed. Each processor in the multi processor system has its own level 1 cache. When a SPECULATE instruction is encountered within the code, that instruction directs the processor to change the way that all data access is handled; all subsequent writes must remain within the level 1 cache and not propagate to shared memory or shared cache (FIG. 2).

When a COMMIT instruction is encountered, all of the data which has been written to the level 1 cache within the SPECULATE/COMMIT region, known as speculatively written data, is propagated to more distant shared caches or memories within the multiprocessor system in a single atomic action (FIG. 3).

In the cases where a read or a write occurs within a SPECULATE/COMMIT region, the full line of data is copied from shared memory into the cache first (FIG. 4). This is to ensure that when a partial write occurs from the processor, the final data written back to shared memory can be guaranteed to be correct. If the data were not copied first from shared memory to local cache then the transfer of partial writes could lead to errors. This is because the parts of the data, which have not been updated in the cache, will retain previous values which are then subsequently passed back to the shared memory (FIG. 5). Copying the data from shared memory first and then overwriting guarantees the integrity of the data which is subsequently written back to shared memory (FIG. 4).

There are a two main reasons why a write will fail in this SPECULATE/COMMIT process. In SPECULATE mode, a write by a processor will fail if the write cannot be performed without causing another speculatively written cache line to be ejected from the level 1 cache. This occurs because the associativity of the cache, i.e. number of locations where data from any given address in memory may be stored, has been exceeded. A COMMIT instruction will fail if any of the speculatively written data would conflict with changes in the shared cache. This occurs if one of the other processors in the system writes to the same cache line address as the one which would have already been changed by the speculatively written data had that data been written direct to shared cache rather than level 1 cache. In some systems this may be detected by hardware and the exception taken immediately that the conflicting write occurs; in other systems, the exception may be deferred until the subsequent commit is encountered. Either type of failure will cause an exception to be taken. If this happens all the accumulated speculatively written data will be discarded.

Use of the SPECULATE/COMMIT instructions therefore results in faster processing as the delays associated with waiting for the semaphore to clear in the TEST/SET style have been removed. The only disadvantage is that, when the code in the SPECULATE/COMMIT region fails to complete properly, the exception handling needs to be more complex to deal with the fact that this is a block of multiple instructions and not a single memory access which has failed.

Simulating multi-processor systems requires changes to existing techniques in order to ensure maximum efficiency and hence simulation speed. One of the more commonly used techniques is that of code-morphing where the simulated processor code is run on the host processor of the machine on which the simulation runs. This is done by means of a code dictionary which, at run time, translates or morphs the code from its original form to the one required for it to run on the host processor.

SUMMARY OF THE PRESENT INVENTION

The invention is a method of simulating a multi-processor system by running code that simulates the system on a host processor, in which:
(a) a SPECULATE and a COMMIT instruction is used to mark an area of memory, shared across several simulated processors, and (b) the code is translated at run time to a form required by the host processor;

wherein all instructions are mapped to a native instruction set of the host using two different code dictionaries.

This is more efficient and hence faster than known methods of simulation.

In an implementation, all instructions outside a SPECULATE/COMMIT region are mapped to the first of the two code dictionaries. But if a SPECULATE instruction is encountered during runtime by a simulator running the code, the instructions are mapped to a native instruction set of the host using the second code dictionary. Instructions within the SPECULATE/COMMIT region are mapped to the native instruction set of the host using a second model that more accurately represents the multi-level memory of the final hardware implementation of the multi-processor system. When a COMMIT instruction is encountered, all instructions are once again mapped the using the first, code dictionary set.

Other implementation features include:

the multi-level memory allows the temporary storage of data associated with instructions within the SPECULATE/COMMIT region.

the second model accesses shared memory only via a level 1 cache associated with the processor handling that instruction.

simulating a failure of instructions within the SPECULATE/COMMIT region involves the simulator using knowledge of the associativity of the level 1 cache.

simulating a failure of instructions within the SPECULATE/COMMIT region involves the steps of:

(a) the simulator suspending simulation of a processor executing within the SPECULATE/COMMIT region in order to simulate another processor;

(b) the simulator traversing the data structure representing the level 1 cache to determine which lines of cache have had speculatively written data placed in them.

addresses containing speculatively written data are then observed by placing a watchpoint on the corresponding addresses in shared memory.

if simulating another processor leads to any of these watchpointed addresses being speculatively written to, the simulator will flag that speculation as failing for that processor.

resumption of simulation for the suspended processor requires checking whether any of the watchpointed addresses associated with that processor have been modified by another processor.

if a watchpointed address has been modified, then the simulator will direct the suspended processor to a simulated exception handler.

Another aspect of the invention is a multi-processor system that has been designed or tested using the simulation method defined above.

A further aspect is computer software operable to simulate a multi-processor system using the simulation method defined above.

A further aspect is a multi-processor development system when programmed with the computer software.

A final aspect is an electronic device including a multi-processor system that has been designed or tested using the simulation method defined above. Electronic devices include personal computers, servers, laptops, mobile telephones and indeed any other kind of device that includes a multi-processor system

BRIEF DESCRIPTION OF THE DRAWINGS

The invention will be described with reference to the accompanying drawings.

DETAILED DESCRIPTION

Simulating Multi-Processor Systems with SPECULATE/COMMIT Instructions

As noted above, simulating multi-processor systems requires changes to existing techniques in order to ensure maximum efficiency and hence simulation speed. One of the more commonly used techniques is that of code-morphing where the simulated processor code is run on the host processor of the machine on which the simulation runs. This is done by means of a code dictionary which, at run time, translates or morphs the code from its original form to the one required for it to run on the host processor.

The simulation of the SPECULATE/COMMIT region of the code requires some special consideration. READ and WRITE instructions can be called both from within the SPECULATE/COMMIT regions and from outside it; these two calls need to be handled differently. Outside any SPECULATE/COMMIT regions the simulation of memory access needs to be done as fast as possible using the host processor however within the SPECULATE/COMMIT regions a more complex model is required. This means that two models are required, where one model is written for speed of simulation and the other is more detailed for accuracy.

It is not possible to determine in advance, by static analysis of the simulated source code, whether a particular instruction is one which will be evaluated in a SPECULATE/COMMIT region or not. A function could, for example, be called from both inside or outside such a region. This would lead to a situation where the same OPCODE has to be run from both regions. This means that both the detailed model, for the call from within the SPECULATE/COMMIT region, and the fast model, for the call from outside this region, need to be available at runtime and need to be selected in the code morphing process. Instructions found within the SPECULATE/COMMIT region need to be mapped to the complex model while calls from outside this region need to be mapped direct to the host instruction set using the standard mapping dictionary.

Dual Dictionary Implementation Details

The technique used to simulate this with maximum efficiency uses the SPECULATE/COMMIT instructions to switch the mapping dictionary so that when a SPECULATE instruction is encountered the code-morpher will use a different set of mapping instructions until the COMMIT instruction is found. When the COMMIT instruction occurs in the code, the COMMIT instruction will complete, then the code dictionary used by the morpher will be switched back to the standard one again.

Figure 6:
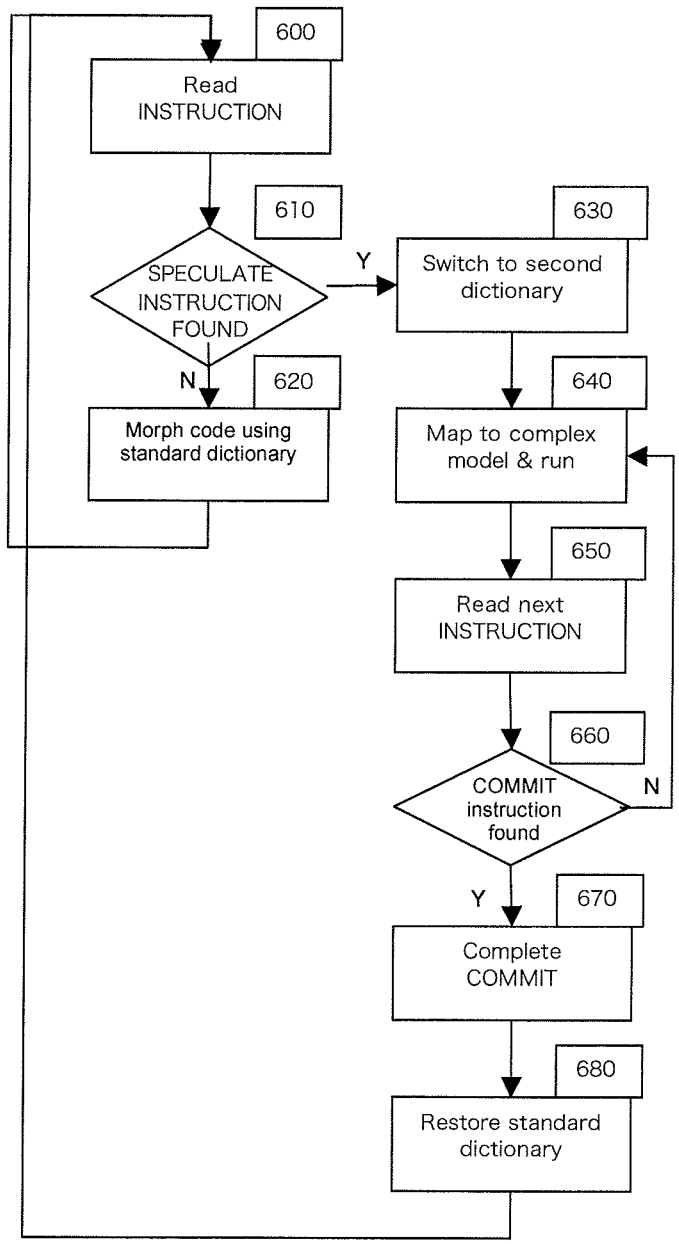
FIG. 6: Details of how the SPECULATE/COMMIT instructions control the use of dictionaries

At runtime the code is read by the simulator and processed instruction by instruction (FIG. 6). Each individual instruction is read 600 and checked to determine whether or not it is a SPECULATE instruction 610. If it is not a SPECULATE instruction it will be passed to the code morphing portion of the software which will map the instruction to native code using the standard code dictionary 620. The next instruction will be processed in the same way 600.

If a SPECULATE instruction is found 610 this causes the code morphing software to use a different dictionary 630 which contains the more complex models. Instructions will continue to be read 650 as before and each instruction will now be checked to determine whether or not it is a COMMIT instruction 660. If it is not, the instruction will be mapped using the complex modelling dictionary 640 and the next instruction read 650. If it is a COMMIT instruction then the COMMIT instruction will be mapped to the complex model 670 and the standard dictionary restored 680 before the next instruction is read 600.

Implementation Details for Complex Modeling

Outside the SPECULATE/COMMIT regions, the models used bypass the actual implementation details and use a dictionary which maps to the native code of the host machine for maximum simulation speed. Within the SPECULATE/COMMIT regions, the possibility of data clashes means that the models be a more accurate representation of the multi-level memory that will exist in the final hardware. It is this multi-level memory which, in the hardware, allows for the temporary storage of data during the processing of the series of instructions which make up the transaction within the SPECULATE/COMMIT region.

Figure 1:
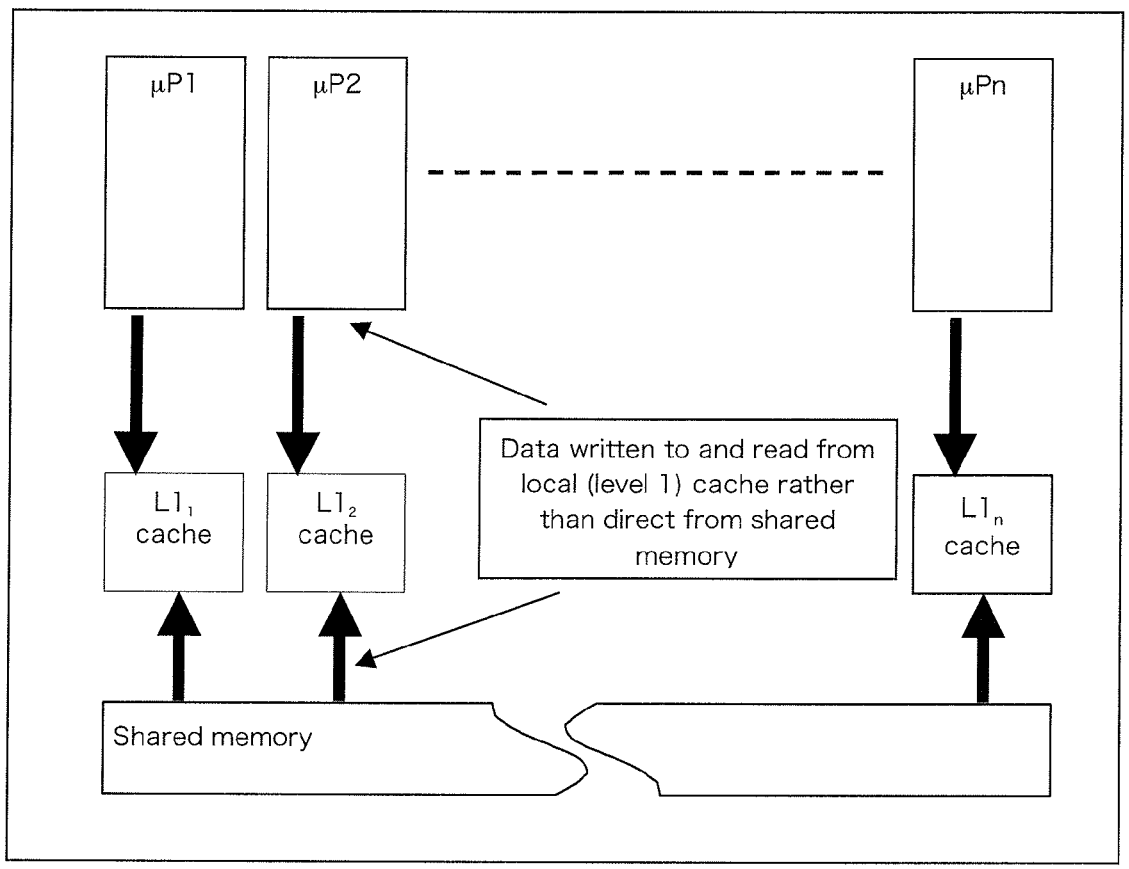
FIG. 1: Modelling of cache and shared memory in a multi-processor system in SPECULATE region of code.
Figure 2:
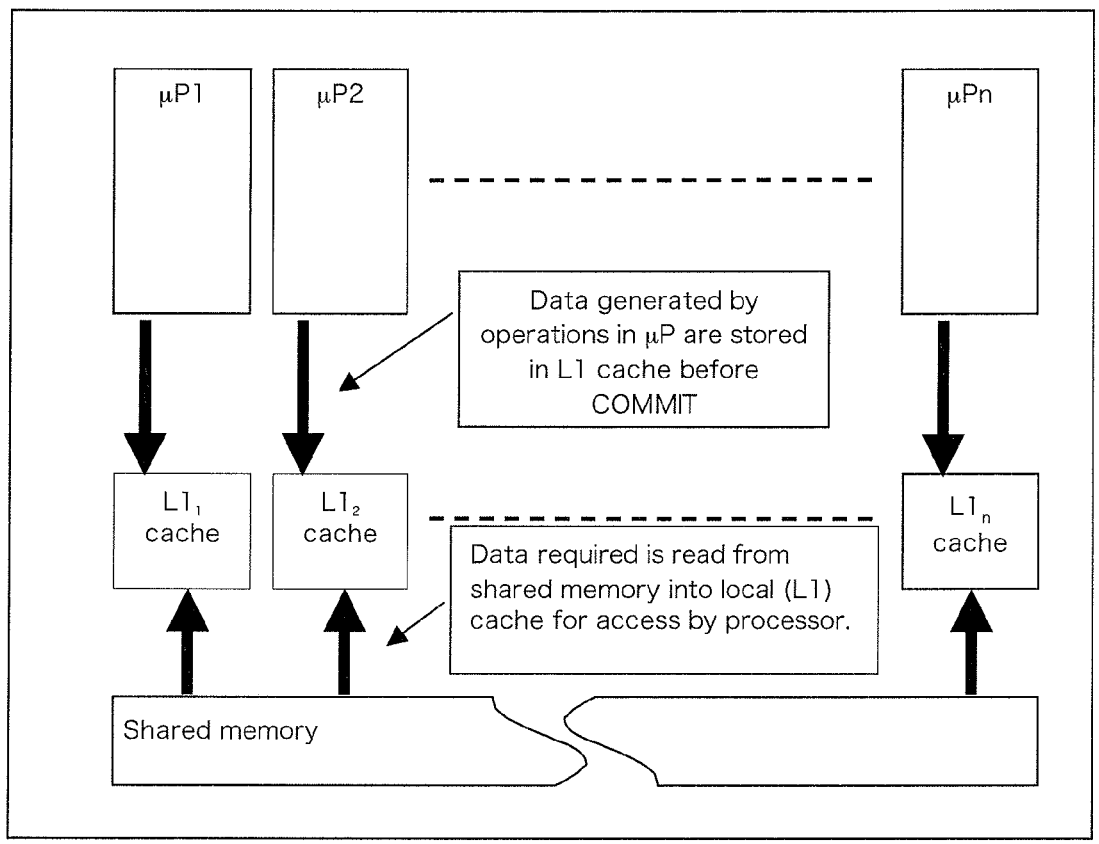
FIG. 2: All speculatively read and written data is held in local cache for access by the local processor only
Figure 3:
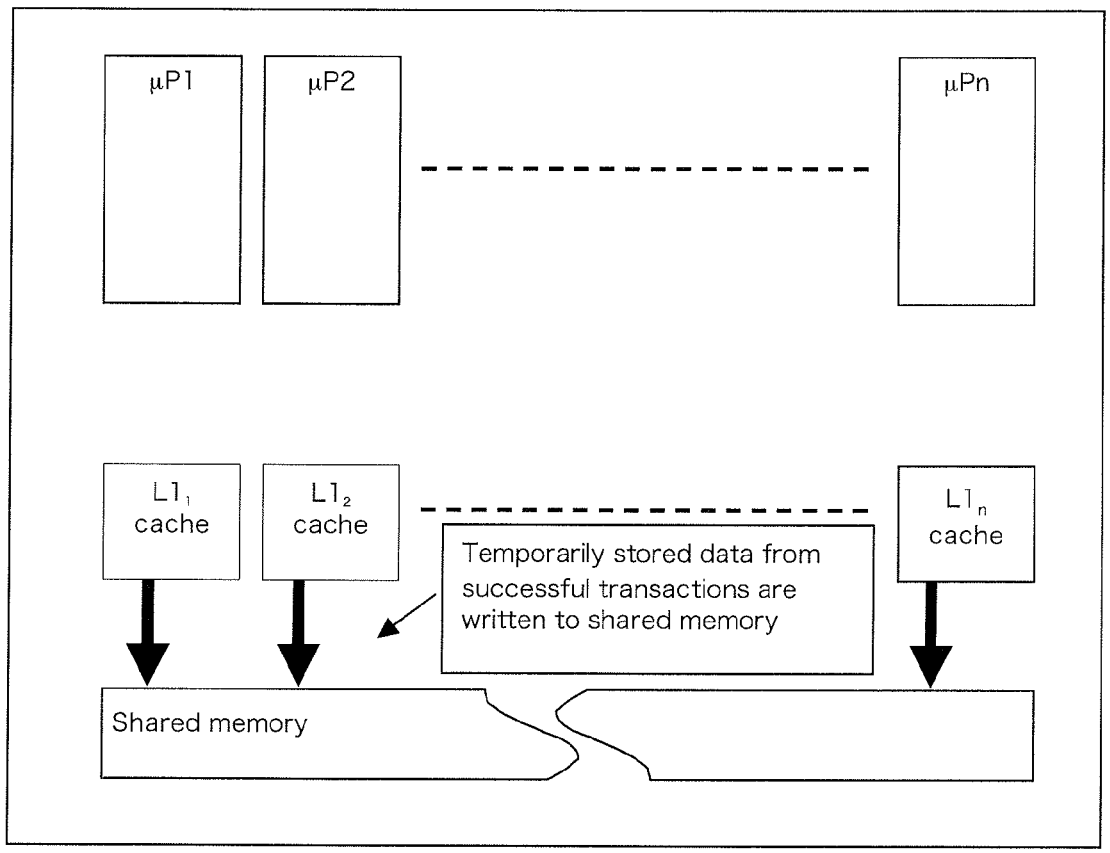
FIG. 3: All data from successful transactions is transferred to shared memory at COMMIT instruction
Figure 4:
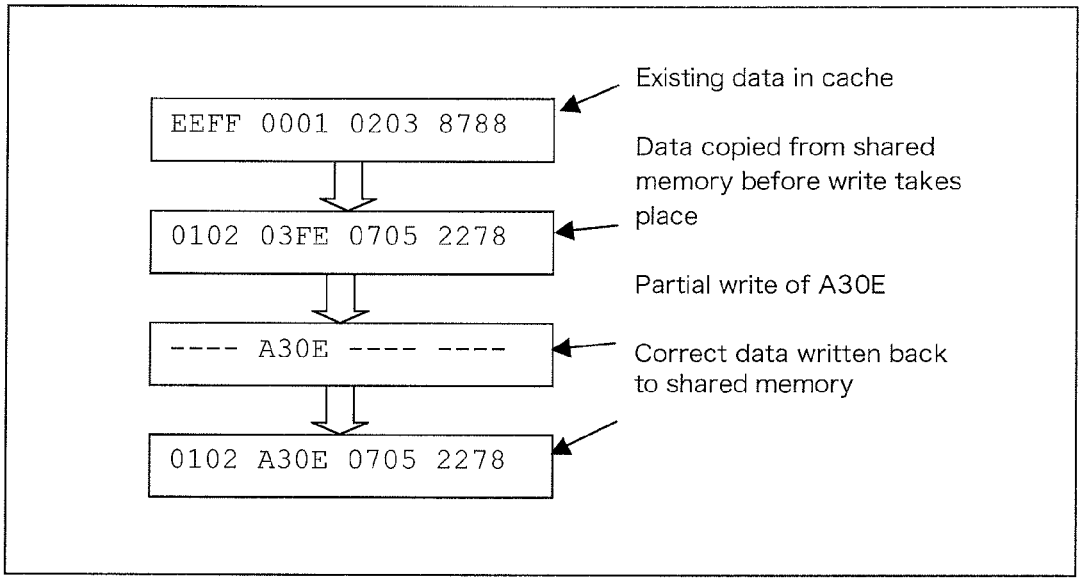
FIG. 4: Generation of correct data in shared memory during a partial WRITE instruction
Figure 5:
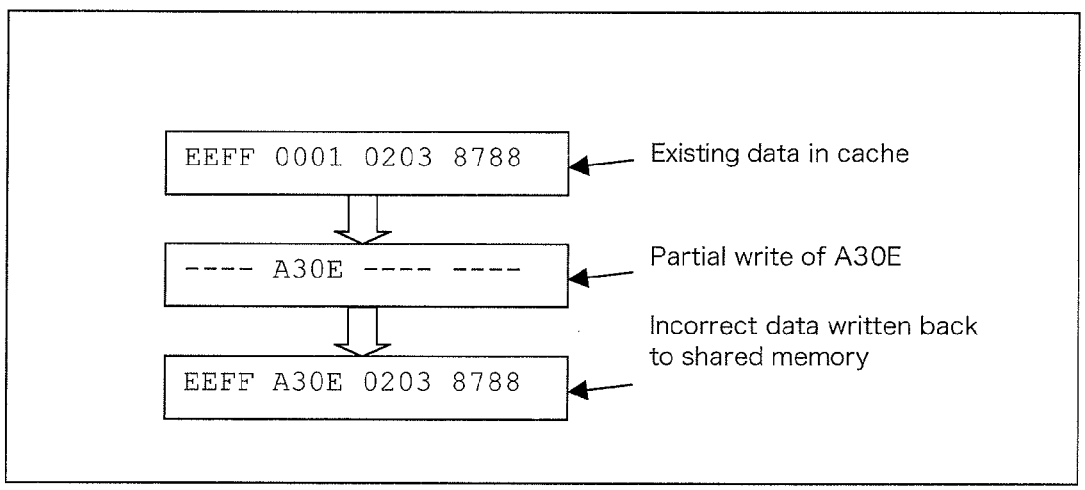
FIG. 5: Generation of incorrect data in shared memory during a partial WRITE instruction

The complex models will access the shared memory but will do so via the level 1 cache associated with the processor handling the data (FIG. 1). A READ instruction will result in the fill data associated with that address being written into the local cache before being used by the processor. Similarly data associated with a WRITE instruction is written out from the processor and stored in the local level 1 cache during the SPECULATE/COMMIT region (FIG. 2). When the COMMIT instruction is reached, if a transaction has completed successfully, the data which was stored in the level 1 cache needs to be made available to the rest of the system (FIG. 3). Any data which has been written from the processor to the level 1 cache is transferred to shared memory.

Maintaining Transactional Coherence and Consistency

The vital element of the modeling of behaviour within the SPECULATE/COMMIT regions is the ability to determine when any transaction has failed. There are two main scenarios which could lead to a failure; either when data in the local cache is invalid because the associativity of the cache has been exceeded or when the data which is being processed is updated by two or more processors within the SPECULATE/COMMIT region.

Figure 7:
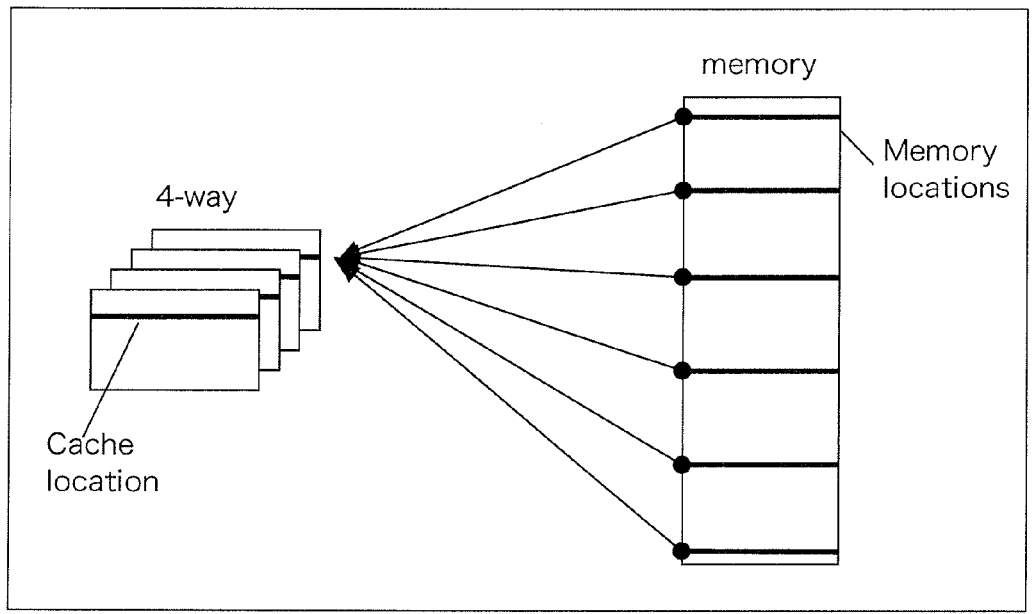
FIG. 7: Memory space is far larger than cache so many locations in memory will map to one location in cache in a simple 1 way cache arrangement.
Figure 8:
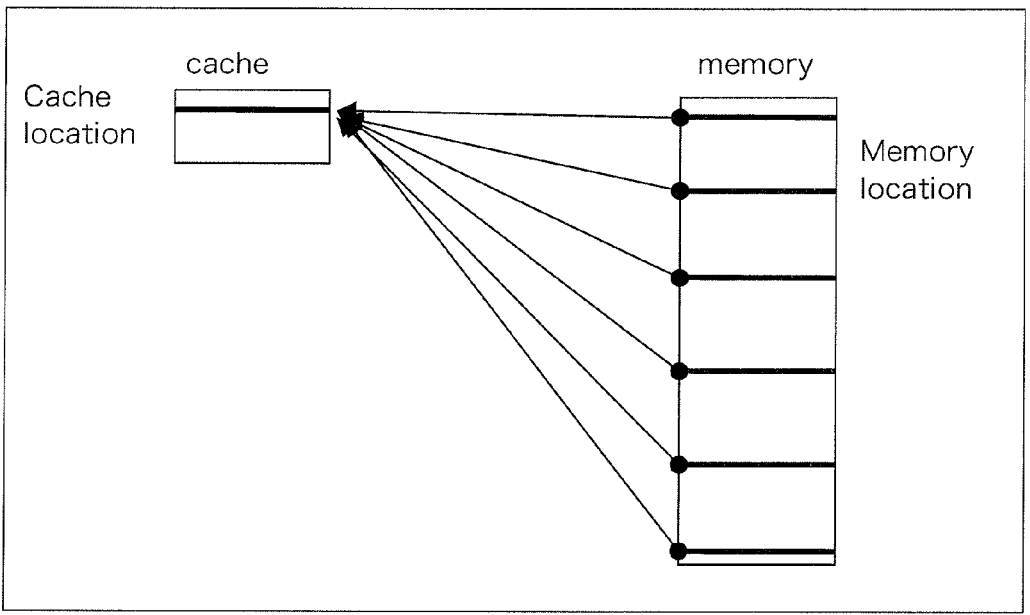
FIG. 8: In an n-way cache there are n different possible ways where the data directed to a particular cache address can be stored. This is known as the associativity of the cache.

In the first instance, failure occurs because the cache is only a small portion of the size of the actual memory (FIG. 7). Each location in the cache can be used to store data from a number of different addresses. If the designated location for new piece of data is already full then this would represent a failure. In the simplest form of cache each piece of data can only be stored in one location; in more complex cache arrangements there a multiple locations where any given piece of data can be stored (FIG. 8). This means that the simulator must take account of this number of ways, or associativity, of the cache and only mark as failures those situations where this number of attempts to write records to that location has been exceeded whilst within a SPECULATE/COMMIT region. So for example, in a 4-way cache, the $5^{th}$ attempt to write data to a given location while in the SPECULATE/COMMIT region would result in a failure.

It should be noted that on entering the SPECULATE/COMMIT region, the data contained in the local cache is all marked as invalid and all locations are marked as available. The simulator then stores details of the status of each location; it can be either available, read from, written to or both read from and written to.

Figure 9:
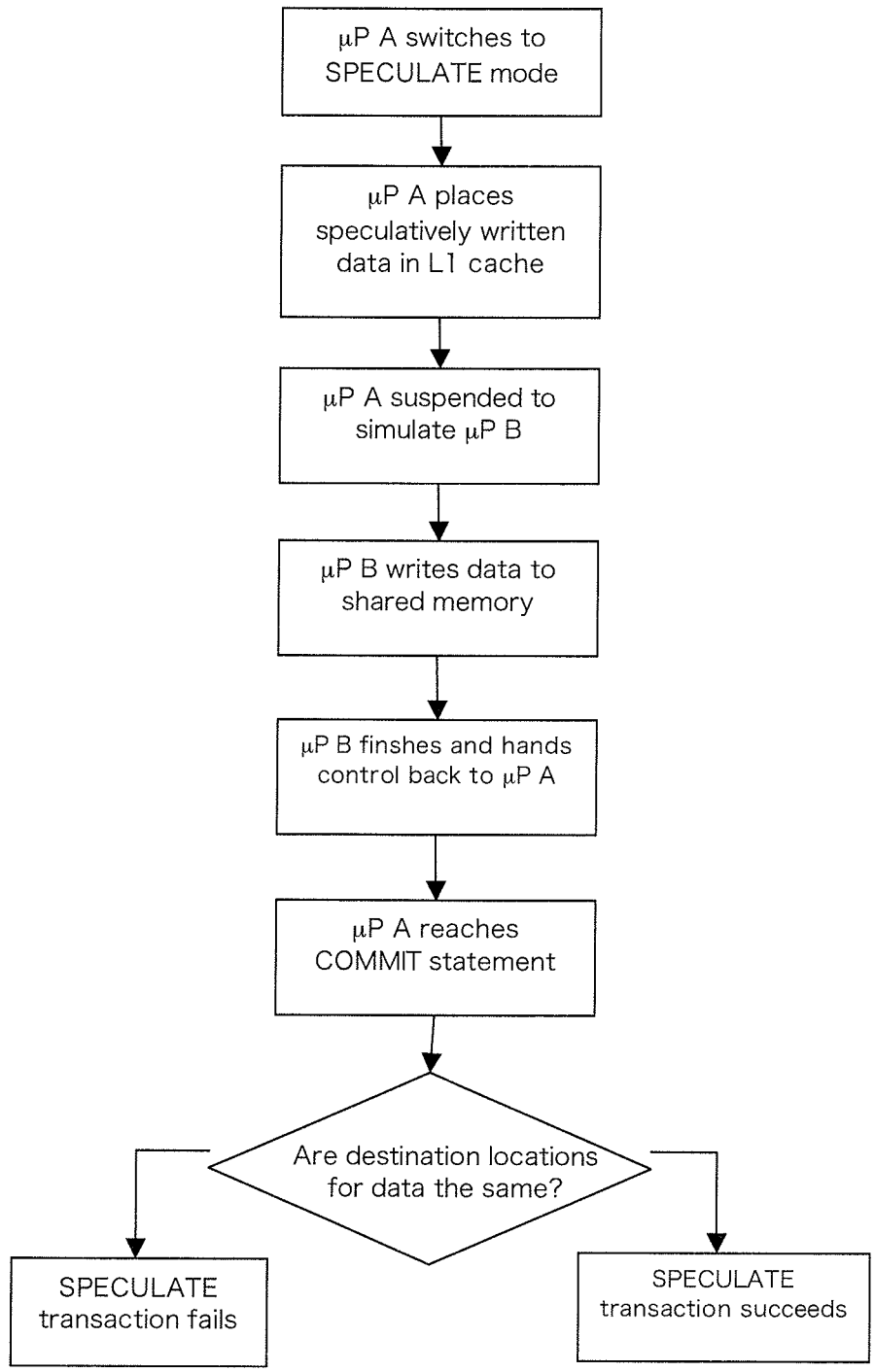
FIG. 9: Flow of operation in a multi-processor system if a processor (mP) in a SPECULATE/COMMIT region is suspended to allow simulation of a second or subsequent processor (mP).

The second kind of failure can occur if a location in cache has been written to by two or more processors while in the SPECULATE/COMMIT region. This scenario occurs if the simulator needs to suspend simulation of one processor executing within a SPECULATE/COMMIT region in order to simulate another processor in the system. In such a case, the simulator must recognise that the first processor is within a SPECULATE/COMMIT region and take additional steps to maintain data integrity. The order of operation is important. If the first processor, which is in SPECULATE mode, places speculatively written data in the same cache line address in the level 1 cache as that in shared cache which is subsequently written to by any operation of another processor, then the speculatively written data is invalid and the whole of the SPECULATE transaction for the first processor would fail (FIG. 9). The reverse is not true. If data is written by the first processor to the same cache address lines as had been written to by the second after the simulator has resumed simulation of the first processor, then the data written by the first would remain valid and the SPECULATE transaction would not fail.

A failure occurs then if data, written by the first processor on completion of that processor's SPECULATE/COMMIT transaction, has the same destination address in shared memory as data which is then written from the second, or in more complex systems, any subsequent processor, on completion of the first processor's SPECULATE/COMMIT transaction. In order to determine when this has occurred, if a processor executing within a SPECULATE/COMMIT region is suspended to simulate another processor in the system, the simulator traverses the data structure representing the cache to determine which lines of cache have had speculatively written data placed in them. These addresses containing speculatively written data are then observed by means of 'watchpoints' which are placed by the simulator on the corresponding addresses in the shared cache. If any of these addresses is then written to during the simulation of the SPECULATE/COMMIT transaction of the second or, in more complex scenarios, any subsequent processor, then the simulator will determine which processor is in speculative mode and attempting to write to that region, and set a flag to indicate that the speculation has failed for that processor. When the simulation eventually resumes execution of the suspended processor, it first checks for any flags, which would indicate that any of the addresses, which contain speculatively written data from before the simulation was suspended, have been modified by another processor during that suspension. If the flag is not set then the simulation continues from the point at which it was suspended. If a flag is set, then the simulator will direct this processor to the simulated exception handler for speculative failure. The precise semantics of this vary from processor to processor: in some processors, the exception should be taken immediately, but in others it may be taken only when the COMMIT instruction is reached at the end of the SPECULATE/COMMIT transaction.

The invention claimed is:

1. A method of simulating a multi-processor system by running system code that simulates the system on a host processor, in which:
   (a) a SPECULATE and a COMMIT instruction in the system code is used to mark an area of memory, shared across several simulated processors, and
   (b) the system code is translated at run time to a form required by the host processor;
   wherein:
   (i) all instructions are mapped to a native instruction set of the host using two different code dictionaries, a first code dictionary and a second code dictionary; and
   (ii) all instructions outside a SPECULATE/COMMIT region are mapped to a native instruction set of the host using the first code dictionary; and
   (iii) instructions within a SPECULATE/COMMIT region are mapped to the native instruction set of the host using the second code dictionary which uses a model that more accurately represents a multi-level memory of a final hardware implementation of the multi-processor system.

2. The method of claim 1 wherein the multi-level memory allows the temporary storage of data associated with instructions within the SPECULATE/COMMIT region.

3. The method of claim 1 wherein the model simulates the way that hardware accesses shared memory only via a level 1 cache associated with the multi-processor system handling that instruction.

4. The method of claim 3 wherein simulating a failure of instructions within the SPECULATE/COMMIT region involves the simulator using knowledge of the associativity of the level 1 cache.

5. The method of claim 4 wherein simulating a failure of instructions within the SPECULATE/COMMIT region involves the steps of:
   (a) the simulator suspending simulation of a first processor executing within the SPECULATE/COMMIT region in order to simulate another processor;
   (b) the simulator traversing a data structure representing the level 1 cache to determine which lines of cache have had speculatively written data placed in them.

6. The method of claim 5 wherein addresses containing speculatively written data are then observed by placing a watchpoint on the corresponding addresses in shared memory.

7. The method of claim 6 wherein, if simulating a second processor leads to any of these watchpointed addresses being speculatively written to, the simulator will flag that speculation as failing for that second processor.

8. The method of claim 7 wherein resumption of simulation for the suspended first processor requires checking whether any of the watchpointed addresses associated with the suspended first processor have been modified by the second processor.

9. The method of claim 8 wherein, if a watchpointed address has been modified, then the simulator will direct the suspended processor to a simulated exception handler.

* * * * *